US008022456B2

(12) United States Patent
Parthasarathy et al.

(10) Patent No.: US 8,022,456 B2
(45) Date of Patent: *Sep. 20, 2011

(54) CHECKERBOARDED HIGH-VOLTAGE VERTICAL TRANSISTOR LAYOUT

(75) Inventors: Vijay Parthasarathy, Mountain View, CA (US); Sujit Banerjee, San Jose, CA (US); Martin H. Manley, Saratoga, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/925,929

(22) Filed: Nov. 1, 2010

(65) Prior Publication Data

US 2011/0089476 A1   Apr. 21, 2011

Related U.S. Application Data

(63) Continuation of application No. 11/707,418, filed on Feb. 16, 2007, now Pat. No. 7,859,037.

(51) Int. Cl.
  *H01L 27/108*   (2006.01)
  *H01L 29/94*   (2006.01)
(52) U.S. Cl. ................ 257/302; 257/E29.262
(58) Field of Classification Search .......... 257/302, 257/E29.262
  See application file for complete search history.

(56) References Cited

U.S. PATENT DOCUMENTS

| | | |
|---|---|---|
| 4,343,015 A | 8/1982 | Baliga et al. |
| 4,531,173 A | 7/1985 | Yamada |
| 4,553,084 A | 11/1985 | Wrathall |
| 4,618,541 A | 10/1986 | Forouhi et al. |
| 4,626,789 A | 12/1986 | Nakata et al. |
| 4,626,879 A | 12/1986 | Colak |
| 4,665,426 A | 5/1987 | Allen et al. |
| 4,738,936 A | 4/1988 | Rice |
| 4,754,310 A | 6/1988 | Coe |
| 4,764,800 A | 8/1988 | Sander |
| 4,769,685 A | 9/1988 | MacIver et al. |
| 4,796,070 A | 1/1989 | Black |
| 4,811,075 A | 3/1989 | Eklund |
| 4,890,144 A | 12/1989 | Teng et al. |
| 4,890,146 A | 12/1989 | Williams et al. |
| 4,922,327 A | 5/1990 | Mena et al. |
| 4,926,074 A | 5/1990 | Singer et al. |
| 4,926,243 A | 5/1990 | Nakagawa et al. |
| 4,929,987 A | 5/1990 | Einthoven |
| 4,939,566 A | 7/1990 | Singer et al. |
| 4,963,951 A | 10/1990 | Adler et al. |
| 4,967,246 A | 10/1990 | Tanaka |
| 5,008,794 A | 4/1991 | Leman |
| 5,010,024 A | 4/1991 | Allen et al. |
| 5,025,296 A | 6/1991 | Fullerton et al. |
| 5,040,045 A | 8/1991 | McArthur et al. |

(Continued)

*Primary Examiner* — Kiesha Bryant
*Assistant Examiner* — Igwe U Anya
(74) *Attorney, Agent, or Firm* — The Law Offices of Bradley J. Bereznak

(57) ABSTRACT

In one embodiment, a transistor fabricated on a semiconductor die includes a first section of transistor segments disposed in a first area of the semiconductor die, and a second section of transistor segments disposed in a second area of the semiconductor die adjacent the first area. Each of the transistor segments in the first and second sections includes a pillar of a semiconductor material that extends in a vertical direction. First and second dielectric regions are disposed on opposite sides of the pillar. First and second field plates are respectively disposed in the first and second dielectric regions. Outer field plates of transistor segments adjoining first and second sections are either separated or partially merged.

13 Claims, 7 Drawing Sheets

U.S. PATENT DOCUMENTS

| | | |
|---|---|---|
| 5,068,700 A | 11/1991 | Yamaguchi et al. |
| 5,072,266 A | 12/1991 | Belucua et al. |
| 5,072,268 A | 12/1991 | Rumennik et al. |
| 5,122,848 A | 6/1992 | Lee et al. |
| 5,146,298 A | 9/1992 | Eklund |
| 5,155,574 A | 10/1992 | Yamaguchi |
| 5,164,891 A | 11/1992 | Keller |
| 5,237,193 A | 8/1993 | Williams et al. |
| 5,258,636 A | 11/1993 | Rumennik et al. |
| 5,270,264 A | 12/1993 | Andideh et al. |
| 5,274,259 A | 12/1993 | Grabowski et al. |
| 5,285,367 A | 2/1994 | Keller |
| 5,294,824 A | 3/1994 | Okada |
| 5,306,656 A | 4/1994 | Williams et al. |
| 5,313,082 A | 5/1994 | Eklund |
| 5,323,044 A | 6/1994 | Rumennik et al. |
| 5,324,683 A | 6/1994 | Fitch et al. |
| 5,326,711 A | 7/1994 | Malhi |
| 5,349,225 A | 9/1994 | Redwine et al. |
| 5,359,221 A | 10/1994 | Miyamoto et al. |
| 5,386,136 A | 1/1995 | Williams et al. |
| 5,411,901 A | 5/1995 | Grabowski et al. |
| 5,438,215 A | 8/1995 | Tihanyi |
| 5,473,180 A | 12/1995 | Ludikhuize |
| 5,514,608 A | 5/1996 | Williams et al. |
| 5,521,105 A | 5/1996 | Hsu et al. |
| 5,550,405 A | 8/1996 | Cheung et al. |
| 5,637,898 A | 6/1997 | Baliga |
| 5,648,283 A | 7/1997 | Tsang et al. |
| 5,654,206 A | 8/1997 | Merrill |
| 5,656,543 A | 8/1997 | Chung |
| 5,659,201 A | 8/1997 | Wollesen |
| 5,663,599 A | 9/1997 | Lur |
| 5,665,994 A | 9/1997 | Palara |
| 5,670,828 A | 9/1997 | Cheung et al. |
| 5,679,608 A | 10/1997 | Cheung et al. |
| 5,716,887 A | 2/1998 | Kim |
| 5,760,440 A | 6/1998 | Kitamura et al. |
| 5,821,144 A | 10/1998 | D'Anna et al. |
| 5,869,875 A | 2/1999 | Hebert |
| 5,917,216 A | 6/1999 | Floyd et al. |
| 5,929,481 A | 7/1999 | Hshieh et al. |
| 5,943,595 A | 8/1999 | Akiyama et al. |
| 5,969,408 A | 10/1999 | Perelli |
| 5,973,360 A | 10/1999 | Tihanyi |
| 5,998,833 A | 12/1999 | Baliga |
| 6,010,926 A | 1/2000 | Rho et al. |
| 6,049,108 A | 4/2000 | Williams et al. |
| 6,054,752 A | 4/2000 | Hara et al. |
| 6,084,277 A | 7/2000 | Disney et al. |
| 6,127,703 A | 10/2000 | Letavic et al. |
| 6,133,607 A | 10/2000 | Funaki et al. |
| 6,168,983 B1 | 1/2001 | Rumennik et al. |
| 6,184,555 B1 | 2/2001 | Tihanyi et al. |
| 6,191,447 B1 | 2/2001 | Baliga |
| 6,194,283 B1 | 2/2001 | Gardner et al. |
| 6,207,994 B1 | 3/2001 | Rumennik et al. |
| 6,294,818 B1 | 9/2001 | Fujihira |
| 6,316,807 B1 | 11/2001 | Fujishima et al. |
| 6,353,252 B1 | 3/2002 | Yasuhara et al. |
| 6,359,308 B1 | 3/2002 | Hijzen et al. |
| 6,362,064 B2 | 3/2002 | McGregor et al. |
| 6,365,932 B1 | 4/2002 | Kouno et al. |
| 6,388,286 B1 | 5/2002 | Baliga |
| 6,404,009 B1 | 6/2002 | Mori et al. |
| 6,424,007 B1 | 7/2002 | Disney |
| 6,462,377 B2 | 10/2002 | Hurkx et al. |
| 6,465,291 B1 | 10/2002 | Disney |
| 6,468,847 B1 | 10/2002 | Disney |
| 6,489,190 B2 | 12/2002 | Disney |
| 6,501,130 B2 | 12/2002 | Disney |
| 6,504,209 B2 | 1/2003 | Disney |
| 6,509,220 B2 | 1/2003 | Disney |
| 6,525,372 B2 | 2/2003 | Baliga |
| 6,552,597 B1 | 4/2003 | Disney et al. |
| 6,555,873 B2 | 4/2003 | Disney et al. |
| 6,555,883 B1 | 4/2003 | Disney et al. |
| 6,563,171 B2 | 5/2003 | Disney |
| 6,570,219 B1 | 5/2003 | Rumennik et al. |
| 6,573,558 B2 | 6/2003 | Disney |
| 6,583,663 B1 | 6/2003 | Disney et al. |
| 6,633,065 B2 | 10/2003 | Rumennik et al. |
| 6,635,544 B2 | 10/2003 | Disney |
| 6,639,277 B2 | 10/2003 | Rumennik et al. |
| 6,667,213 B2 | 12/2003 | Disney |
| 6,677,641 B2 | 1/2004 | Kocon |
| 6,680,646 B2 | 1/2004 | Disney |
| 6,683,344 B2 | 1/2004 | Tsukanov et al. |
| 6,683,346 B2 | 1/2004 | Zeng |
| 6,724,041 B2 | 4/2004 | Rumennik et al. |
| 6,730,585 B2 | 5/2004 | Disney |
| 6,734,714 B2 | 5/2004 | Disney |
| 6,750,105 B2 | 6/2004 | Disney et al. |
| 6,759,289 B2 | 7/2004 | Disney |
| 6,764,889 B2 | 7/2004 | Baliga |
| 6,768,171 B2 | 7/2004 | Disney |
| 6,768,172 B2 | 7/2004 | Rumennik et al. |
| 6,777,749 B2 | 8/2004 | Rumennik et al. |
| 6,781,194 B2 | 8/2004 | Baliga |
| 6,781,198 B2 | 8/2004 | Disney |
| 6,787,437 B2 | 9/2004 | Rumennik et al. |
| 6,787,847 B2 | 9/2004 | Disney et al. |
| 6,787,848 B2 | 9/2004 | Ono et al. |
| 6,798,020 B2 | 9/2004 | Disney et al. |
| 6,800,903 B2 | 10/2004 | Rumennik et al. |
| 6,809,354 B2 | 10/2004 | Okada et al. |
| 6,815,293 B2 | 11/2004 | Disney et al. |
| 6,818,490 B2 | 11/2004 | Disney |
| 6,825,536 B2 | 11/2004 | Disney |
| 6,828,631 B2 | 12/2004 | Rumennik et al. |
| 6,838,346 B2 | 1/2005 | Disney |
| 6,865,093 B2 | 3/2005 | Disney |
| 6,882,005 B2 | 4/2005 | Disney et al. |
| 6,987,299 B2 | 1/2006 | Disney et al. |
| 7,115,958 B2 | 10/2006 | Disney et al. |
| 7,135,748 B2 | 11/2006 | Balakrishnan |
| 7,220,629 B2 | 5/2007 | Balakrishnan |
| 7,221,011 B2 * | 5/2007 | Banerjee et al. ............... 257/288 |
| 7,253,042 B2 | 8/2007 | Disney et al. |
| 7,253,059 B2 | 8/2007 | Balakrishnan |
| 7,335,944 B2 | 2/2008 | Banerjee |
| 7,381,618 B2 | 6/2008 | Disney |
| 7,391,088 B2 | 6/2008 | Balakrishnan |
| 7,459,366 B2 | 12/2008 | Banerjee |
| 7,468,536 B2 | 12/2008 | Parthasarathy |
| 7,494,875 B2 | 2/2009 | Disney |
| 7,557,406 B2 | 7/2009 | Parthasarathy |
| 7,585,719 B2 | 9/2009 | Balakrishnan |
| 7,595,523 B2 | 9/2009 | Parthasarathy et al. |
| 7,732,860 B2 | 6/2010 | Parthasarathy et al. |
| 7,859,037 B2 * | 12/2010 | Parthasarathy et al. ....... 257/302 |
| 7,863,172 B2 | 1/2011 | Zhu |
| 7,871,882 B2 | 1/2011 | Parthasarathy |
| 7,875,962 B2 | 1/2011 | Balakrishnan |
| 7,893,754 B1 | 2/2011 | Kung |
| 2001/0015459 A1 | 8/2001 | Watanabe et al. |
| 2002/0056884 A1 | 5/2002 | Baliga |
| 2002/0175351 A1 | 11/2002 | Baliga |
| 2003/0209757 A1 | 11/2003 | Henninger et al. |
| 2005/0167742 A1 * | 8/2005 | Challa et al. .................. 257/328 |
| 2005/0167749 A1 | 8/2005 | Disney |
| 2005/0218963 A1 | 10/2005 | Ball et al. |

\* cited by examiner

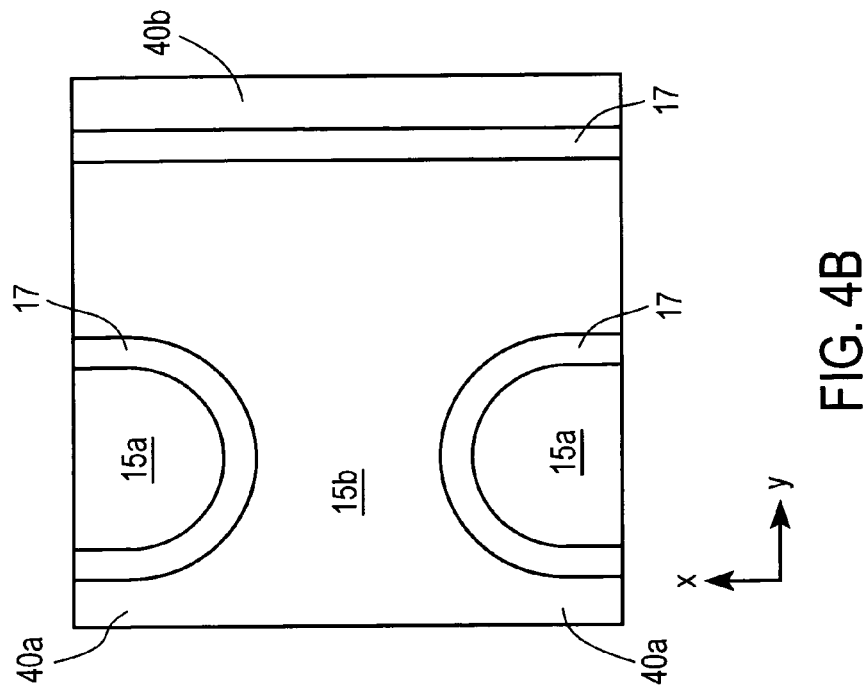
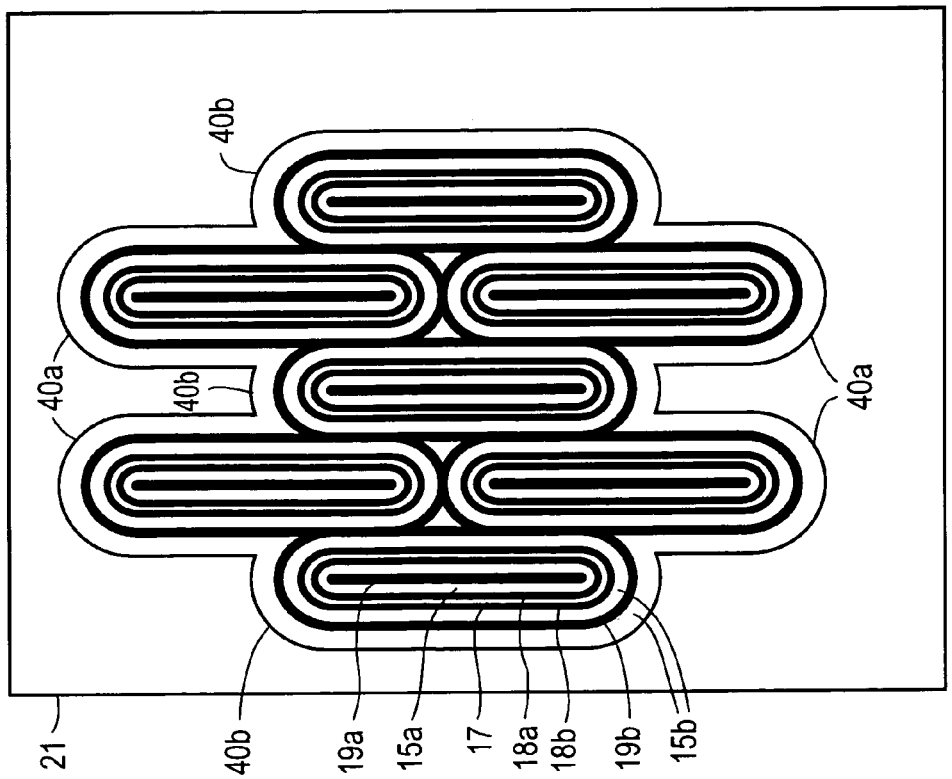
FIG. 4A
FIG. 4B

US 8,022,456 B2

CHECKERBOARDED HIGH-VOLTAGE VERTICAL TRANSISTOR LAYOUT

This application is a continuation of application Ser. No. 11/707,418, filed Feb. 16, 2007, now U.S. Pat. No. 7,859,037 entitled, "CHECKERBOARDED HIGH-VOLTAGE VERTICAL LAYOUT", which is assigned to the assignee of the present application.

TECHNICAL FIELD

The present disclosure relates to semiconductor device structures and processes for fabricating high-voltage transistors.

BACKGROUND

High-voltage, field-effect transistors (HVFETs) are well known in the semiconductor arts. Many HVFETs employ a device structure that includes an extended drain region that supports or blocks the applied high-voltage (e.g., several hundred volts) when the device is in the "off" state. In a conventional vertical HVFET structure, a mesa or pillar of semiconductor material forms the extended drain or drift region for current flow in the on-state. A trench gate structure is formed near the top of the substrate, adjacent the sidewall regions of the mesa where a body region is disposed above the extended drain region. Application of an appropriate voltage potential to the gate causes a conductive channel to be formed along the vertical sidewall portion of the body region such that current may flow vertically through the semiconductor material, i.e., from a top surface of the substrate where the source region is disposed, down to the bottom of the substrate where the drain region is located.

In a traditional layout, a vertical HVFET consists of long continuous silicon pillar structure that extends across the semiconductor die, with the pillar structure being repeated in a direction perpendicular to the pillar length. One problem that arises with this layout, however, is that it tends to produce large warping of the silicon wafer during high temperature processing steps. In many processes, the warping is permanent and large enough to prevent the wafer from tool handling during subsequent processing steps.

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

FIG. 4A illustrates yet another example layout of the vertical HVFET structure shown in FIG. 1.

FIG. 4B is an expanded view of one portion of the example layout shown in FIG. 4A.

DETAILED DESCRIPTION

In the following description specific details are set forth, such as material types, dimensions, structural features, processing steps, etc., in order to provide a thorough understanding of the present invention. However, persons having ordinary skill in the relevant arts will appreciate that these specific details may not be needed to practice the present invention. It should also be understood that the elements in the figures are representational, and are not drawn to scale in the interest of clarity.

Figure 1:
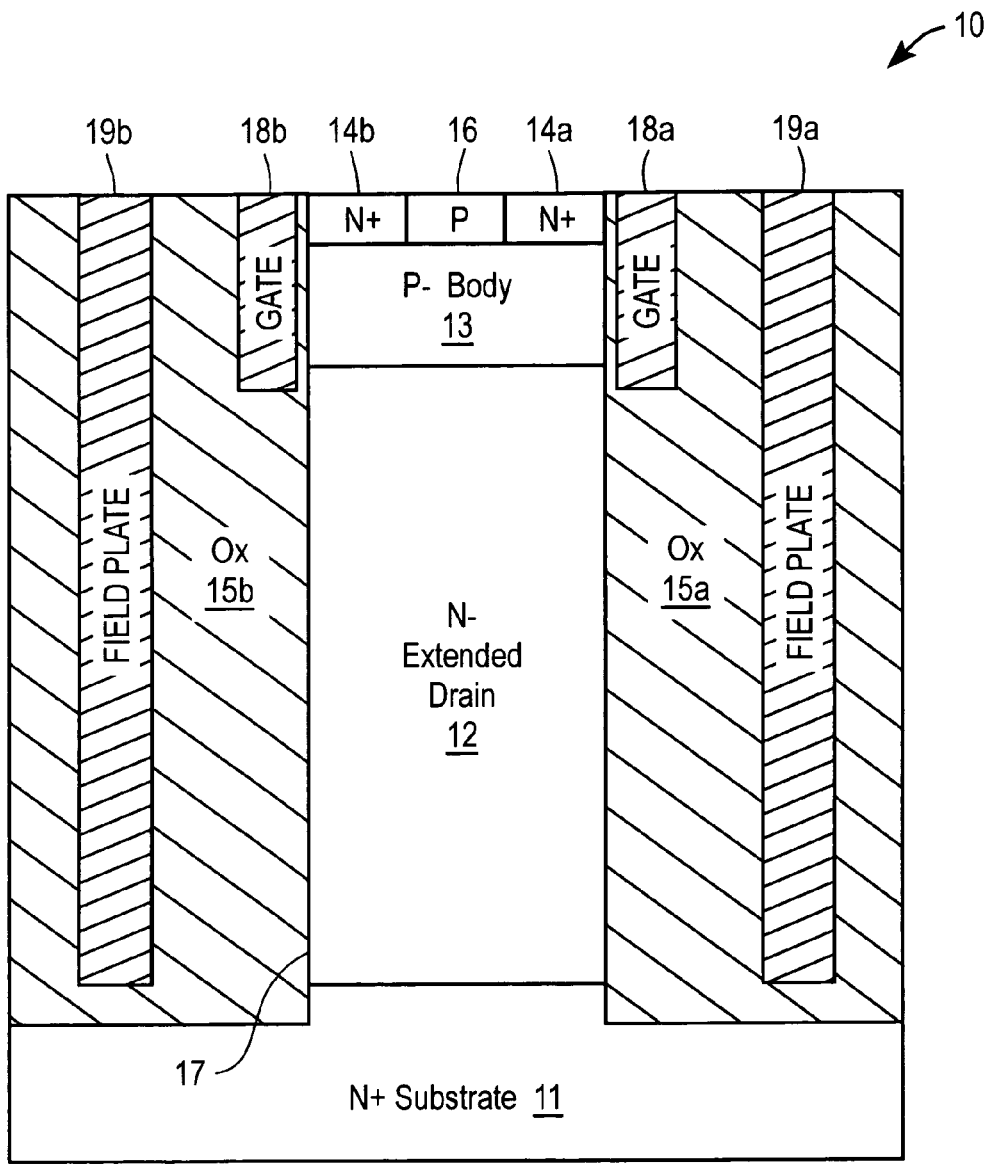
FIG. 1 illustrates an example cross-sectional side view of a vertical HVFET structure.

FIG. 1 illustrates an example cross-sectional side view of a vertical HVFET 10 having a structure that includes an extended drain region 12 of N-type silicon formed on an N+ doped silicon substrate 11. Substrate 11 is heavily doped to minimize its resistance to current flowing through to the drain electrode, which is located on the bottom of the substrate in the completed device. In one embodiment, extended drain region 12 is part of an epitaxial layer that extends from substrate 11 to a top surface of the silicon wafer. A P-type body region 13 and N+ doped source regions 14a & 14b laterally separated by a P-type region 16, are formed near a top surface of the epitaxial layer. As can be seen, P-type body region 13 is disposed above and vertically separates extended drain region 12 from N+ source regions 14a & 14b and P-type region 16.

In one embodiment, the doping concentration of the portion of epitaxial layer which comprises extended drain region 12 is linearly graded to produce an extended drain region that exhibits a substantially uniform electric-field distribution. Linear grading may stop at some point below the top surface of the epitaxial layer 12.

Extended drain region 12, body region 13, source regions 14a & 14b and P-type region 16 collectively comprise a mesa or pillar 17 (both terms are used synonymously in the present application) of silicon material in the example vertical transistor of FIG. 1. Vertical trenches formed on opposite sides of pillar 17 are filled with a layer of dielectric material (e.g., oxide) that makes up dielectric region 15. The height and width of pillar 17, as well as the spacing between adjacent vertical trenches may be determined by the breakdown voltage requirements of the device. In various embodiments, mesa 17 has a vertical height (thickness) in a range of about 30 µm to 120 µm thick. For example, a HVFET formed on a die approximately 1 mm×1 mm in size may have a pillar 17 with a vertical thickness of about 60 µm. By way of further example, a transistor structure formed on a die of about 2 mm-4 mm on each side may have a pillar structure of approximately 30 µm thick. In certain embodiments, the lateral width of pillar 17 is as narrow as can be reliably manufactured (e.g., about 0.4 µm to 0.8 µm wide) in order to achieve a very high breakdown voltage (e.g., 600-800V).

In another embodiment, instead of arranging P-type region 16 between N+ source regions 14a & 14b across the lateral width of pillar 17 (as shown in FIG. 1), N+ source regions and P-type regions may be alternately formed at the top of pillar 17 across the lateral length of pillar 17. In other words, a given cross-sectional view such as that shown in FIG. 1 would have either an N+ source region 14, or a P-type region 16, that extends across the full lateral width of pillar 17, depending upon where the cross-section is taken. In such an embodiment, each N+ source region 14 is adjoined on both sides (along the lateral length of the pillar) by P-type regions 16. Similarly, each P-type region 16 is adjoined on both sides (along the lateral length of the pillar) by N+ source regions 14.

Dielectric regions 15a & 15b may comprise silicon dioxide, silicon nitride, or other suitable dielectric materials. Dielectric regions 15 may be formed using a variety of well-known methods, including thermal growth and chemical vapor deposition. Disposed within each of the dielectric layers 15, and fully insulated from substrate 11 and pillar 17, is a field plate 19. The conductive material used to from field plates 19 may comprise a heavily doped polysilicon, a metal (or metal alloys), a silicide, or other suitable materials. In the completed device structure, field plates 19a & 19b normally function as capacitive plates that may be used to deplete the extended drain region of charge when the HVFET is in the off state (i.e., when the drain is raised to a high voltage potential). In one embodiment, the lateral thickness of oxide region 15 that separates each field plate 19 from the sidewall of pillar 17 is approximately 4 μm.

The trench gate structure of vertical HVFET transistor 80 comprises gate members 18a & 18b, each respectively disposed in oxide regions 15a & 15b on opposite sides of pillar 17 between field plates 19a & 19b and body region 13. A high-quality, thin (e.g., ~500 Å) gate oxide layer separates gate members 18 from the sidewalls of pillar 17 adjacent body region 13. Gate members 18 may comprise polysilicon, or some other suitable material. In one embodiment, each gate member 18 has a lateral width of approximately 1.5 μm and a depth of about 3.5 μm.

Practitioners in the art will appreciate that N+ source regions 14 and P-type body region 13 near the top of pillar 17 may each be formed using ordinary deposition, diffusion, and/or implantation processing techniques. After formation of the N+ source region 38, HVFET 10 may be completed by forming source, drain, gate, and field plate electrodes that electrically connect to the respective regions/materials of the device using conventional fabrication methods (not shown in the figures for clarity reasons).

Figure 2B:
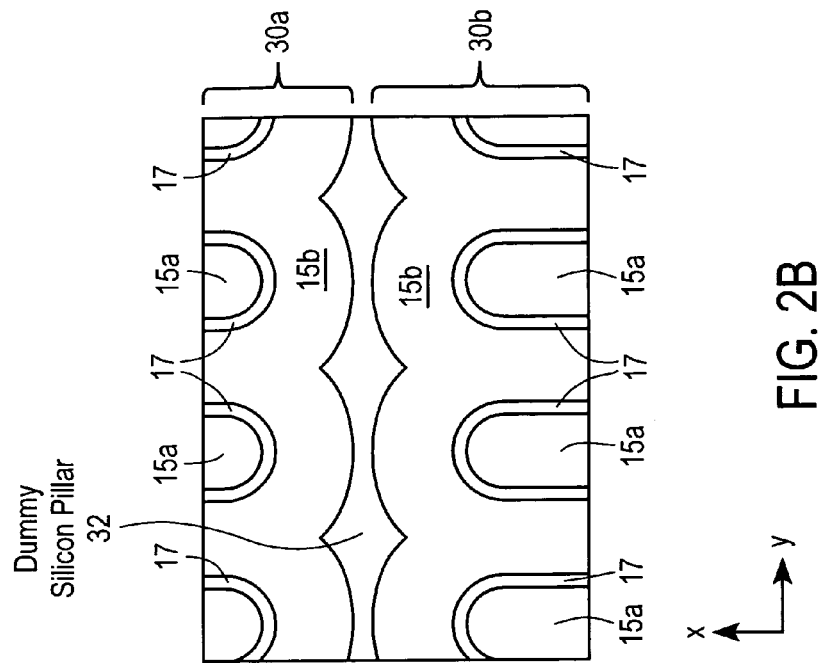
FIG. 2B is an expanded view of one portion of the example layout shown in FIG. 2A.
Figure 2A:
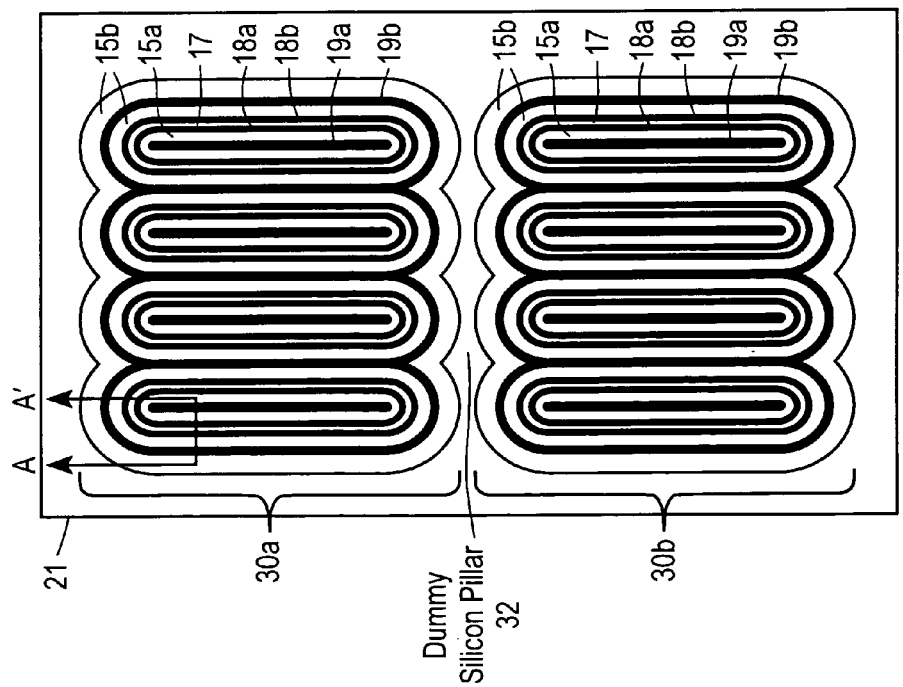
FIG. 2A illustrates an example layout of the vertical HVFET structure shown in FIG. 1.

FIG. 2B is an expanded view of one portion of the example layout shown in FIG. 2A. For purposes of clarity, only pillars 17 and dielectric regions 15a & 15b of each of the transistor segments is represented. Dummy silicon pillar 32 is shown separating the rounded end areas of dielectric regions 15b of respective transistor segment sections 30a & 30b. In other words, the deep vertical trenches that are etched in the semiconductor substrate to define pillars 17 also define dummy silicon pillar 32. In one embodiment, dummy silicon pillar 32 is made to have a width in the x-direction (i.e., that separates the transistor segment sections) that is as small as can be reliably manufactured. It should be understood that in the example of FIG. 2A, each of the racetrack transistor segments has a width (i.e., pitch) in the y-direction of approximately 13 μm, a length in the x-direction in a range of about 400 μm to 1000 μm, with a pillar height of about 60 μm. In other words, the length to width ratio of the individual racetrack transistor segments comprising sections 30a & 30b is in a range of about 30 up to 80. In one embodiment, the length of each racetrack shaped segment is at least 20 times greater than its pitch or width.

Practitioners in the art will appreciate that in the completed device structure, patterned metal layers are used to interconnect each of the silicon pillars 17 of the individual transistor segments. That is, in a practical embodiment, all of the source regions, gate members, and field plates are respectively wired together to corresponding electrodes on the die. In the embodiment shown, the transistor segments in each section 30 are arranged in a side-by-side relationship in the y-direction substantially across a width of die 21. Similarly, in the x-direction the additive length of the transistor segments of sections 30a & 30b extend substantially over the length of die 21. In the example layout of FIG. 2A the width of dielectric regions 15 separating the silicon pillars, as well as the width of the field plates, is substantially uniform across semiconductor die 21. Laying out the transistor segments with uniform widths and separation distances prevents the formation of voids or holes following the processing steps used to conformally deposit the layers that comprise dielectric regions 15 and field plates 19.

FIG. 2B is an expanded view of one portion of the example layout shown in FIG. 2A. For purposes of clarity, only pillars 17 and dielectric regions 15b of each of the transistor segments is represented. Dummy silicon pillar 32 is shown separating the rounded end areas of dielectric regions 15b of respective transistor segment sections 30a & 30b. In other words, the deep vertical trenches that are etched in the semiconductor substrate to define pillars 17 also define dummy silicon pillar 32. In one embodiment, dummy silicon pillar 32 is made to have a width in the x-direction (i.e., that separates the transistor segment sections) that is as small as can be reliably manufactured.

The purpose of segmenting the single die HVFET into sections separated by dummy silicon pillar 32 is to introduce lengthwise (x-direction) stress-relief in the elongated racetrack shaped transistor segments. Segmenting or breaking the transistor device structures into two or more sections relieves mechanical stress across the length of the die. This stress is induced by the oxide regions flanking the pillars and normally concentrates at the rounded ends of each racetrack segment. Relieving mechanical stress by segmenting the transistor device structures into two or more sections thus prevents undesirable warping of the silicon pillars and damage (e.g., dislocations) to the silicon caused by stress.

It is appreciated that a tradeoff exists between the stress relief provided by a highly segmented layout and loss of conduction area. More segmentation results in greater stress relief, but at the expense of conduction area. In general, the greater the vertical height of the pillars and the larger the semiconductor die, the greater the number of transistor sections or segments that will be required. In one embodiment, for a 2 mm×2 mm die with 60 μm high pillars, adequate stress relief is provided in a HVFET with an on-resistance of about 1 ohm utilizing a layout comprising four racetrack transistor sections separated by dummy silicon pillars, each having a pitch (y-direction) of about 13 μm and a length (x-direction) of about 450 μm.

In another embodiment, instead of a dummy pillar of silicon to separate pairs of racetrack transistor segments, each pair being located in a different section, a dummy pillar comprising a different material may be utilized. The material used for the dummy pillar should have a thermal coefficient of expansion close to that of silicon, or sufficiently different from that of the dielectric region so as to relieve the lengthwise stress induced by the dielectric regions flanking the silicon pillars.

Figure 3B:
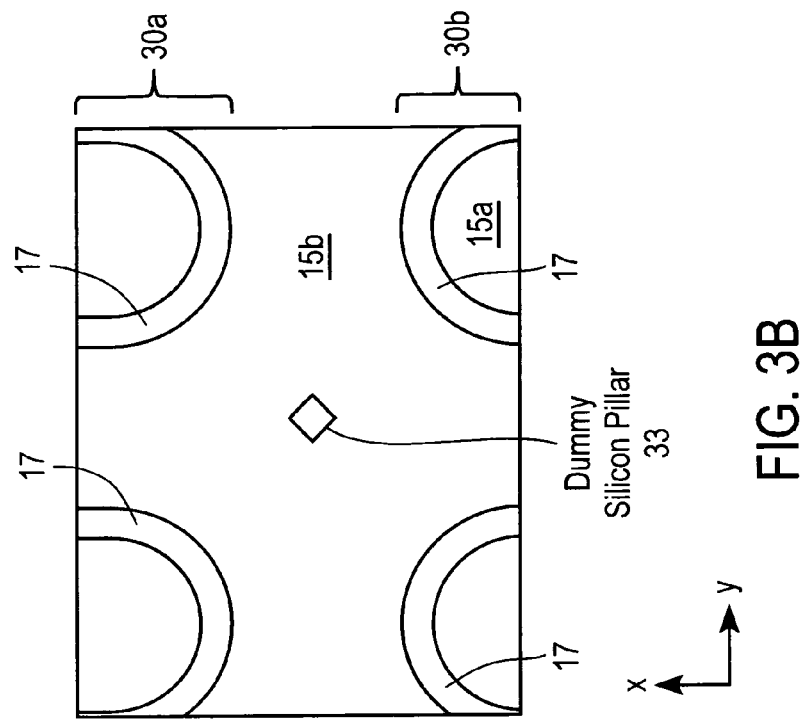
FIG. 3B is an expanded view of one portion of the example layout shown in FIG. 3A.
Figure 3A:
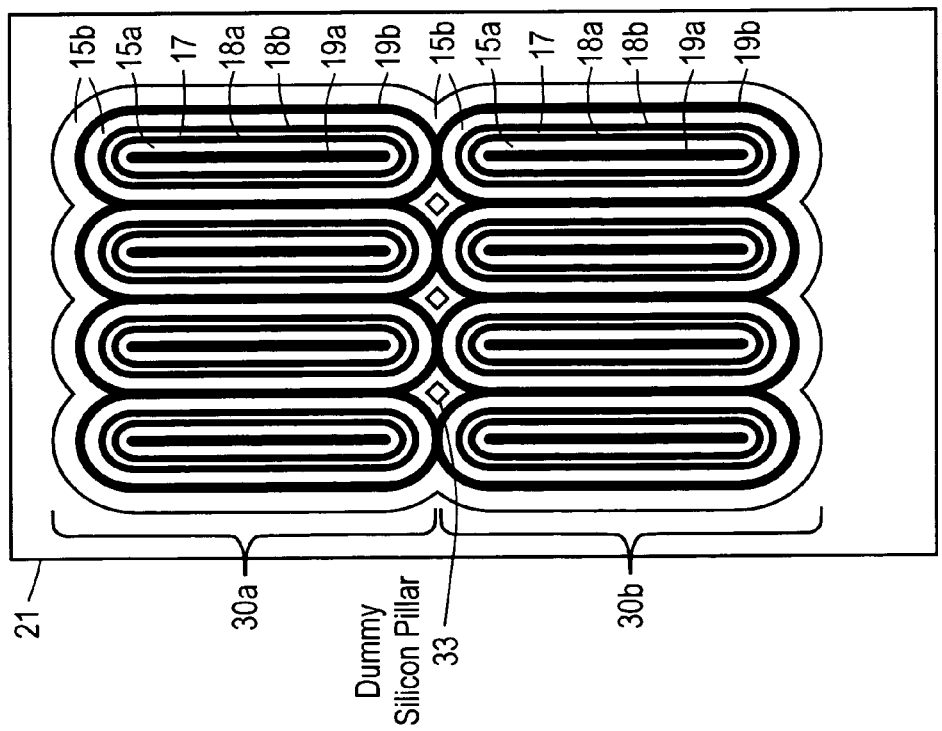
FIG. 3A illustrates another example layout of the vertical HVFET structure shown in FIG. 1.

FIG. 3A illustrates another example layout of the vertical HVFET structure shown in FIG. 1. FIG. 3B is an expanded view of one portion of the example layout shown in FIG. 3A, just showing pillars 17, oxide region 15b, and an optional dummy silicon pillar 33. Similar to the embodiment of FIGS. 2A & 2B, FIGS. 3A & 3B show a single, discrete HVFET comprising an upper transistor section 30a and a lower transistor section 30b on a semiconductor die 21. But in the example of FIGS. 3A & 3B, the deep vertical trenches filled with oxide regions 15b and field plates 19b of transistor sections 30a and 30b overlap, or are merged, leaving small, diamond-shaped dummy silicon pillars 33 between the segmented transistor sections. In this embodiment, a single dummy pillar is centrally located between the four rounded ends of adjacent pairs of transistor segments over the two sections. In the example shown, for every N (where N is an integer greater than 1) racetrack segments or structures in a section 30 of the transistor comprising die 21, there are a total of N−1 dummy pillars 33.

FIG. 4A illustrates yet another example layout of the vertical HVFET structure shown in FIG. 1. FIG. 4B is an expanded view of one portion of the example layout shown in FIG. 4A. Pillars 17 and oxide region 15b are just shown for clarity reasons in the expanded view of FIG. 4B. In this example, the transistor segments comprising the HVFET of semiconductor die 21 are alternately shifted by half of the length of each racetrack segment, resulting in racetrack transistor segments that are alternately associated with upper transistor section 40a and lower transistor section 40b. In other words, each of the transistor segments of a row of section 40a is separated by a pair of the transistor segments of section 40b, the pair being arranged in an end-to-end relationship in the x-direction.

It is appreciated that the alternate shifting of the segments may be any fraction of the segment length. In other words, shifting of the segments is not limited to 50% or half the length. Various embodiments may comprise segments alternately shifted by any percentage or fraction ranging from greater than 0% to less than 100% of the length of the transistor segments.

In the example of FIGS. 4A & 4B, the dielectric regions 15b of alternating ones of the transistor segments in respective sections 40a & 40b are merged. In the specific embodiment shown, the rounded ends of the transistor segments associated with different adjacent sections overlap or are merged such that field plates 19b of the adjacent sections are merged at the ends (in the x-direction). Also, the extended straight side portions of field plates 19b of alternating transistor segments of different sections are merged along a substantial length of each segment. It is appreciated that regions 15b and 19b may be merged with or without a dummy pillar (or isolated dummy silicon pillars) between the respective sections.

Figure 5:
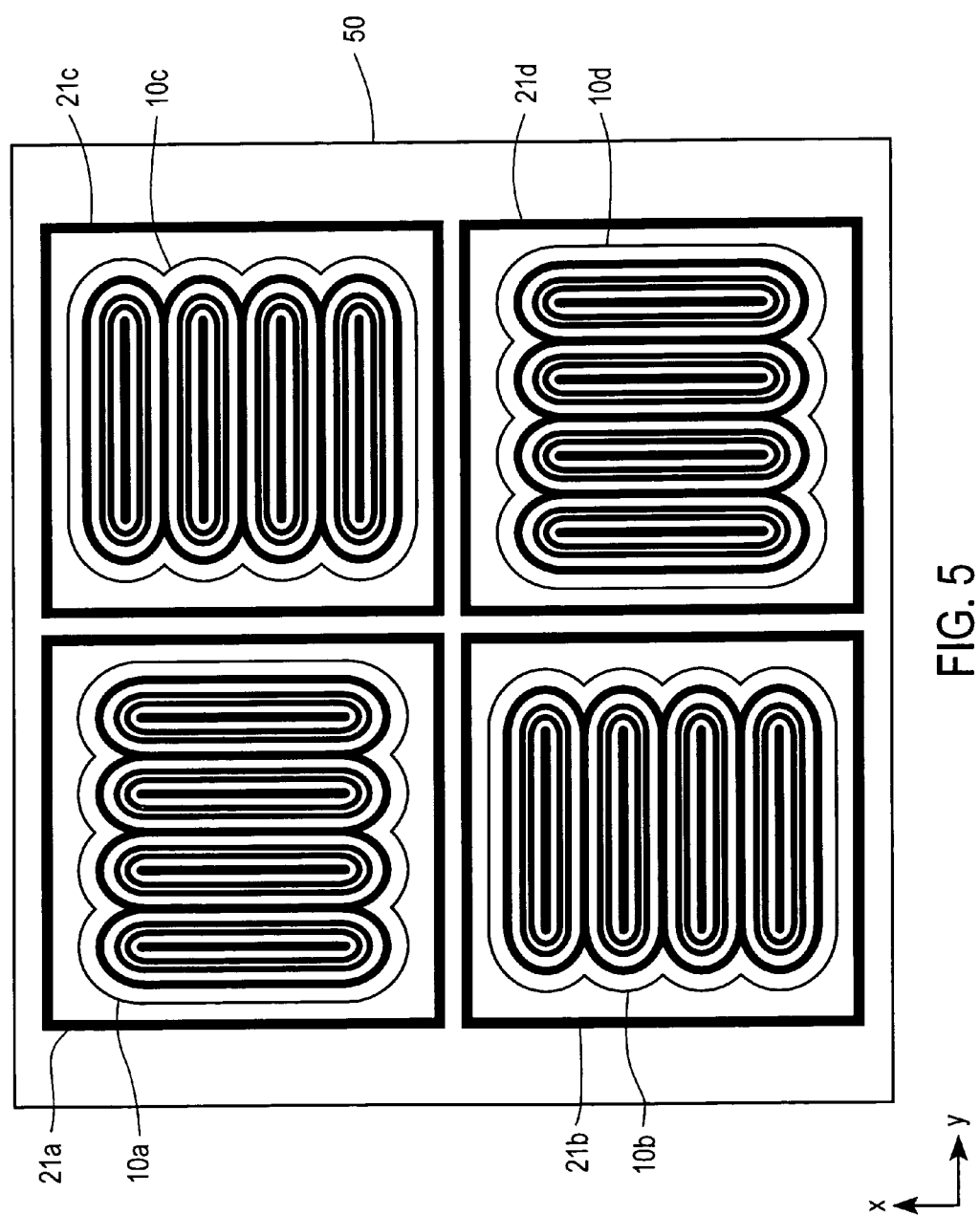
FIG. 5 illustrates an example layout of a wafer with die-to-die checkerboarding of HVFETs.

FIG. 5 illustrates an example layout of a wafer 50 with die-to-die checkerboarding of HVFETs 10a-10d on semiconductor die 21a-21d, respectively. Each of HVFETs 10 comprises a plurality of racetrack-shaped transistor segments such as that shown in FIG. 1, arranged side-by-side along their width into a substantially square block. In this example, HVFETs 10a-10d each comprises transistor segments having a length that extends substantially across the length of the respective die 21a-21d. In one embodiment, the width of each segment is about 13 μm, with the length ranging from about 500 μm to 2000 μm. Other embodiments may have lengths greater than 2000 μm. The block or stacked arrangement of segments also extends substantially across the width of each die. (Note that the bordered square of each die 21 represents the edge of the scribe area between adjacent semiconductor die.) Although FIG. 5 shows two rows and two columns of HVFETs 10 it is appreciated that the die-to-die checkerboarding arrangement shown may be repeated across the entire wafer substrate.

In the example of FIG. 5 adjacent die in a row or a column are oriented such that the length of the transistor segments in one die extends in one direction, with the length of the transistor segments in an adjacent die extending in a second orthogonal direction. For instance, HVFET 10a is shown with the length of its transistor segments oriented in the x-direction, whereas adjacent HVFETs 10b & 10c By orthogonally alternating the orientation of the transistor segments in each individual die 21 across wafer 50 (i.e., checkerboarding) mechanical stress generated by the long dielectric regions is distributed in two orthogonal directions, thus reducing warping of wafer 50.

Figure 6:
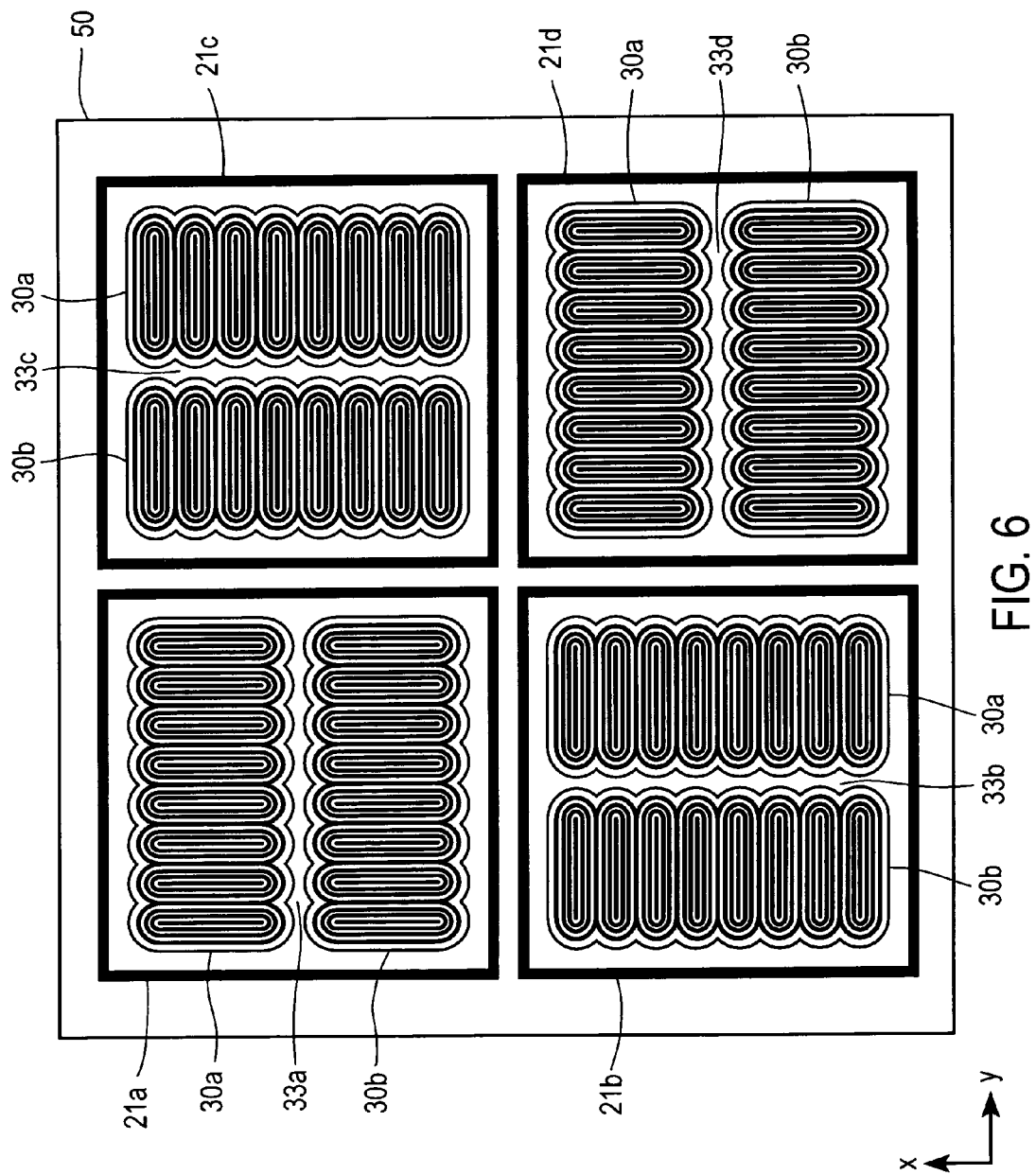
FIG. 6 illustrates an example layout of a wafer with die-to-die checkerboarding of segmented HVFETs.

FIG. 6 illustrates another example layout of a wafer with die-to-die checkerboarding of segmented HVFETs. The example of FIG. 6 utilizes the same approach as in FIG. 5 of alternating the orientation of the transistor structures die-to-die; however, in the embodiment of FIG. 6, the HVFET structures are segmented into multiple (e.g., two) sections. For instance, each HVFET that extends substantially across the length and width of a semiconductor die 21 is segmented into two sections 30a & 30b separated by a dummy pillar 32.

Each of the semiconductor die 21 shown in FIG. 6 has a layout that is the same as that shown in FIG. 2A for a substantially square die. Similar to the example shown in FIG. 5, adjacent die have transistor segments that are orthogonally alternating across wafer 50. That is, the transistor segments in sections 30a & 30b of die 21a and 21d have a length oriented in the x-direction, whereas the transistor segments in sections 30a & 30b of die 21b and 21c have a length oriented in the y-direction.

It is appreciated that the HVFET of each die 21 may be formed with multiple transistor sections, e.g., greater than 2, each separated by one or more dummy pillars. Furthermore, any of the single die layouts with multiple transistor sections shown in the examples of FIGS. 2A-4B may be utilized in each of the die 21 shown in FIG. 6, with the orientation of the segments alternating die-to-die across wafer 50.

Figure 7:
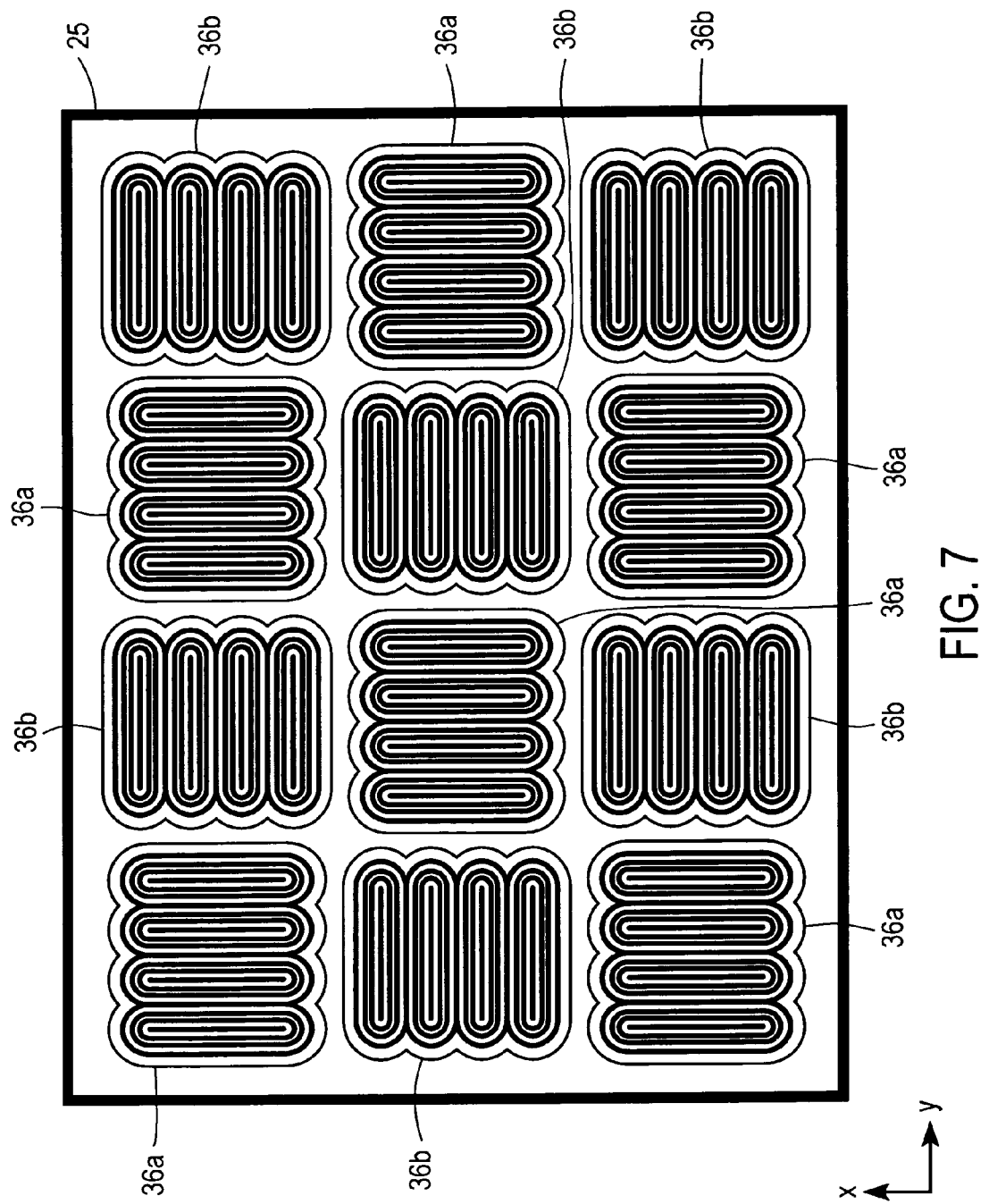
FIG. 7 illustrates an example layout of a rectangular die with checkerboarded blocks of HVFET segments.

FIG. 7 illustrates an example rectangular layout of a die 25 with checkerboarded blocks of racetrack-shaped HVFET segments stacked in a side-by-side arrangement of substantially square blocks or sections 36. Adjacent sections in a row or a column are oriented such that the length of the transistor segments in one section extends in one direction, with the length of the transistor segments in the other adjacent section extending in a second orthogonal direction. For example, each of the rows and columns of die 25 include transistor sections 36a oriented with the elongated transistor segments aligned in the x-direction and alternate transistor sections 36b oriented with the elongated transistor segments aligned in the y-direction. The spaces between sections 36a and 36b comprise dummy silicon pillars; that is, the silicon that forms the dummy pillars is not an active transistor region.

In the embodiment shown, die 25 comprises three rows and four columns of transistor sections 36. The checkerboarded layout approach shown in the example of FIG. 7 may be used to produce a single, discrete HVFET on a die of virtually any (within practical limits) rectilinear-shape.

Although the above embodiments have been described in conjunction with a specific device types, those of ordinary skill in the arts will appreciate that numerous modifications and alterations are well within the scope of the present invention. For instance, although HVFETs have been described, the methods, layouts and structures shown are equally applicable to other structures and device types, including Schottky, diode, IGBT and bipolar structures. Accordingly, the specification and drawings are to be regarded in an illustrative rather than a restrictive sense.

We claim:

1. A transistor comprising:
   a semiconductor die;
   a plurality of transistor segments organized into a plurality of sections, each transistor segment having a length and a width, the length being substantially greater than the width, the transistor segments of each section being arranged in a side-by-side relationship along the width, each transistor segment including:

a pillar of a semiconductor material that extends in a vertical direction, the pillar having a source region disposed near a top surface, of the semiconductor die, an extended drain region, and a body region that vertically separates the source and extended drain regions;

first and second dielectric regions disposed on opposite sides of the pillar, respectively, the first dielectric region being laterally surrounded by the pillar, and the second dielectric region laterally surrounding the pillar;

first and second field plates respectively disposed in the first and second dielectric regions, the first and second field plates being fully insulated from the extended drain region, the first field plate being laterally surrounded by the pillar, and the second field plate laterally surrounding the pillar;

the sections being arranged in rows and columns substantially across the semiconductor die, adjacent sections in a row or a column being oriented such that the length of the transistor segments in a first one of the adjacent sections extends in a first direction, and the length of the transistor segments in a second one of the adjacent sections extends in a second direction, the first direction being substantially orthogonal to the second direction.

2. The transistor of claim 1 wherein each section is substantially square.

3. The transistor of claim 1 wherein the length is at least 20 times greater than the width.

4. The transistor of claim 1 further comprising a trench gate structure that includes first and second gate members respectively disposed in the first and second dielectric regions near a top of the pillar adjacent the body region.

5. The transistor of claim 1 wherein a ratio of the length to the width of the transistor segments in the first and second sections is in a range of about 30 to 80.

6. The transistor of claim 1 wherein the pillar extends in the first and second lateral directions to form a racetrack-shaped ring or oval.

7. The transistor of claim 1 wherein the plurality of sections comprise 2N sections, where N is an integer greater than or equal to one.

8. A high-voltage, field-effect transistor (HVFET) comprising:

a plurality of transistor segments organized on a die into a plurality of sections, each transistor segment having a length elongated in a first lateral direction and a width in a second lateral direction, the transistor segments of each section being arranged in a side-by-side relationship along the width, each transistor segment including:

a pillar of a semiconductor material of a first conductivity type, the pillar having a racetrack-shape in the first and second lateral directions, the pillar including a source region disposed near a top surface of the die, and an extended drain region that extends in a vertical direction through the die;

first and second dielectric regions disposed on opposite sides of the pillar, respectively, the first dielectric region being laterally surrounded by the pillar, and the second dielectric region laterally surrounding the pillar;

first and second field plates respectively disposed in the first and second dielectric regions, the first and second field plates being fully insulated from the extended drain region, the first field plate being laterally surrounded by the pillar, and the second field plate laterally surrounding the pillar;

the sections being arranged in rows and columns substantially across the semiconductor die, adjacent sections in a row or a column being oriented such that the length of the transistor segments in a first one of the adjacent sections extends in a first direction, and the length of the transistor segments in a second one of the adjacent sections extends in a second direction, the first direction being substantially orthogonal to the second direction.

9. The HVFET of claim 8 wherein each section is substantially square.

10. The HVFET of claim 8 wherein the length in the first direction is substantially greater than the width in the second direction.

11. The HVFET of claim 10 wherein the length is at least 20 times greater than the width.

12. The HVFET of claim 8 wherein the first and second field plates function as capacitive plates that deplete the extended drain region of charge when the HVFET is in an off-state.

13. The HVFET of claim 8 wherein the plurality of sections comprise 2N sections, where N is an integer greater than or equal to one.

\* \* \* \* \*

UNITED STATES PATENT AND TRADEMARK OFFICE
CERTIFICATE OF CORRECTION

| | | |
|---|---|---|
| PATENT NO. | : 8,022,456 B2 | Page 1 of 1 |
| APPLICATION NO. | : 12/925929 | |
| DATED | : September 20, 2011 | |
| INVENTOR(S) | : Parthasarathy et al. | |

It is certified that error appears in the above-identified patent and that said Letters Patent is hereby corrected as shown below:

Column 4, Lines 42-48 reads:

"In one embodiment, for a 2mm × 2mm die with 60μm high pillars, adequate stress relief is provided in a HVFET with an on-resistance of about 1 ohm utilizing a layout comprising four racetrack transistor sections separated by dummy silicon pillars, each having a pitch (y-direction) of about 13μm and a length (x-direction) of about 450μm."

It should read:

"In one embodiment, for a 2mm × 2mm die with 60μm high pillars, adequate stress relief is provided in a HVFET with an on-resistance of about 1 ohm utilizing a layout comprising four racetrack transistor sections separated by dummy silicon pillars, each having a pitch (x-direction) of about 13μm and a length (y-direction) of about 450μm."

Signed and Sealed this
Thirty-first Day of July, 2012

David J. Kappos
*Director of the United States Patent and Trademark Office*